United States Patent [19]
Sverdlov et al.

[11] Patent Number: 5,888,886
[45] Date of Patent: Mar. 30, 1999

[54] METHOD OF DOPING GAN LAYERS P-TYPE FOR DEVICE FABRICATION

[75] Inventors: Boris N. Sverdlov, Los Gatos; Jo Stephen Major, Jr., San Jose, both of Calif.

[73] Assignee: SDL, Inc., San Jose, Calif.

[21] Appl. No.: 884,774

[22] Filed: Jun. 30, 1997

[51] Int. Cl.$^6$ .................................................. H01L 21/20
[52] U.S. Cl. .......................... 438/505; 438/503; 117/952
[58] Field of Search .................................... 438/505, 503; 257/184; 118/719; 117/952

[56] References Cited

U.S. PATENT DOCUMENTS

| | | |
|---|---|---|
| 4,368,098 | 1/1983 | Manasevit . |
| 5,278,435 | 1/1994 | Van Hove et al. ...................... 257/184 |
| 5,290,393 | 3/1994 | Nakamura . |
| 5,306,662 | 4/1994 | Nakamura et al. . |
| 5,334,277 | 8/1994 | Nakamura . |
| 5,433,169 | 7/1995 | Nakamura . |
| 5,438,198 | 8/1995 | Ebitani et al. . |
| 5,563,422 | 10/1996 | Nakamura et al. . |
| 5,578,839 | 11/1996 | Nakamura et al. . |
| 5,730,802 | 3/1998 | Ishizumi et al. ........................ 118/719 |

FOREIGN PATENT DOCUMENTS 1011979   5/1967   United Kingdom .

OTHER PUBLICATIONS

K. Boer, Survey of Semiconductor Physics, Van Nostrand Reinhold, p. 474 (no month given) 1990.

T. Kuech et al., "OMVPE of Compound Semiconductors", in Thin Film Processes II, edited by Vossen et al., Academic Press, pp. 387, 427, 431–433 (no month given) 1991.

Maruska et al, "Violet Luminescence of Mg–doped GaN", Applied Physics Letters, vol. 22, No. 6, 15 Mar. 1973.

Amano et al, "P–Type Conduction in Mg–Doped GaN Treated with Low–Energy Electron Beam Irradiation (LEEBI)", Japanese Journal of Applied Physics, vol. 28, No. 12, Dec. 1988, pp. L2112–L2114.

Nakamura et al, "Thermal Annealing Effects on P–Type Mg–Doped GaN Films", Japanese Journal of Applied Physics, vol. 31 (1992) pp. L139–L142.

Dupuis et al, "Preparation and Properties of $Ga_{1-x}Al_xAs$–GaAs Heterostructure Lasers Grown by Metalorganic Chemical Vapor Deposition", IEEE Journal of Quantum Electronics, vol. QE–15, No. 3, 1979, pp. 128–135.

Manasevit, "Recollections and Reflections of MO–CVD", Journal of Crystal Growth 55, (1981).

Manasevit et al, "The Use of Metal–Organics in the Preparation of Semiconductor Materials", Journal of the Electrochemical Society, vol. 116, No. 12, Dec. 1969, pp. 1725–1732.

Cullen et al, "Heteroepitaxial Semiconductors for Electronic Devices", pp. 106–149, 1978.

"Overview of the OMVPE Process", pp. 1–53.

Primary Examiner—Charles Bowers
Assistant Examiner—Keith Christianson
Attorney, Agent, or Firm—Harness, Dickey & Pierce, P.L.C.

[57] ABSTRACT

High p-type impurity concentration levels are achieved in Group III nitride semiconductor layers by depositing a nitrogen-rich surface onto a supporting layer while impeding the flow of Group III element reactant. Thereafter, the Group III element source is introduced into the reactor to generate a p-type region having a high impurity concentration. The flow of the reactant from the active nitrogen source is kept below about 300 sccm and the temperature of the reactor is reduced below 1075° C. in order to provide improved surface characteristics.

25 Claims, 3 Drawing Sheets

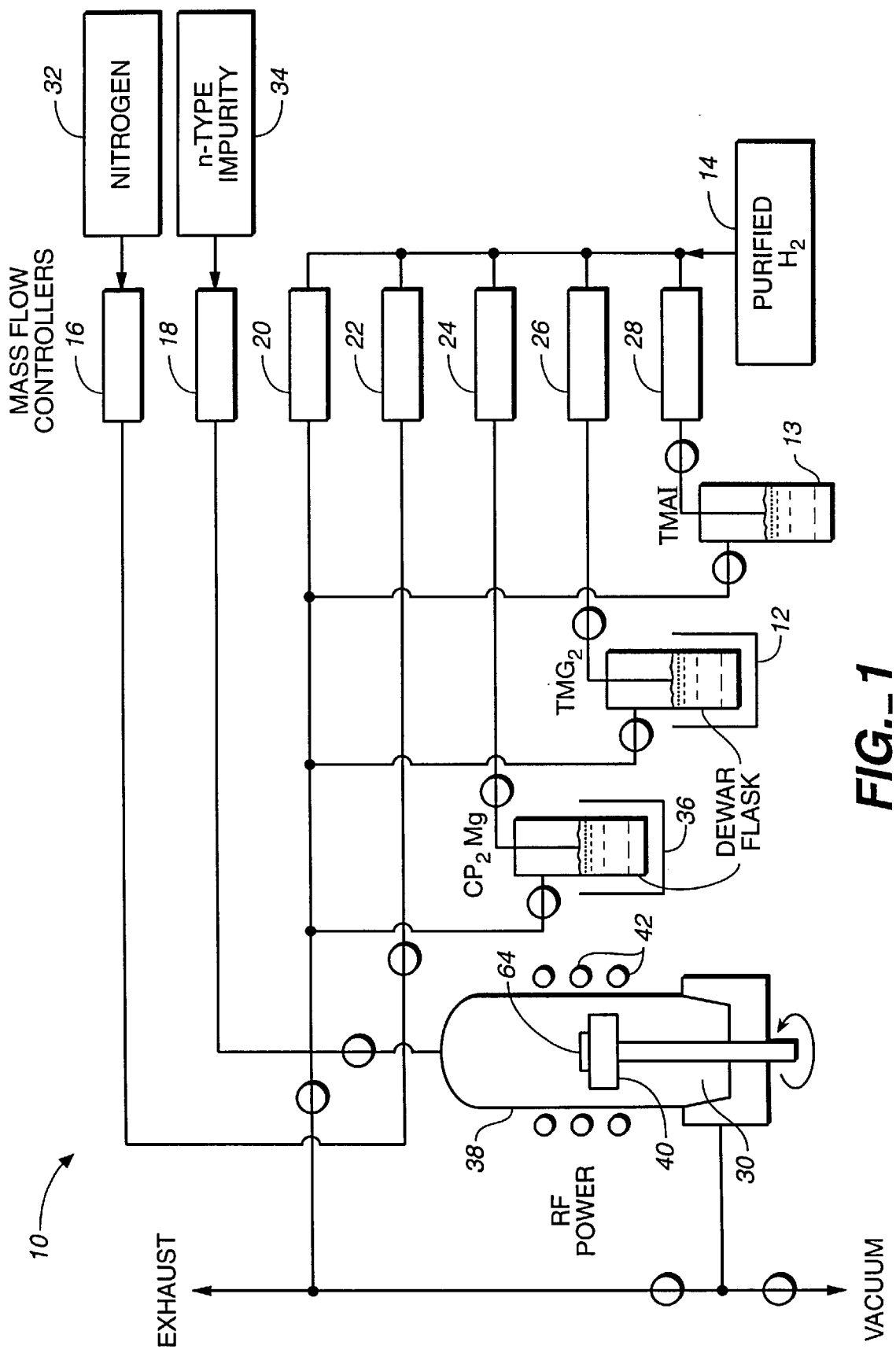
FIG._1

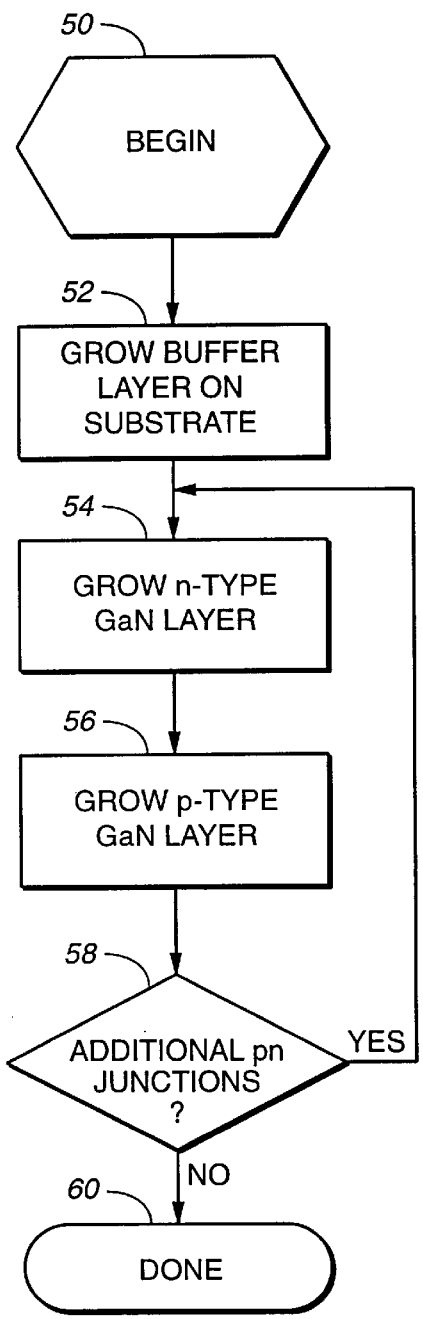
FIG._2
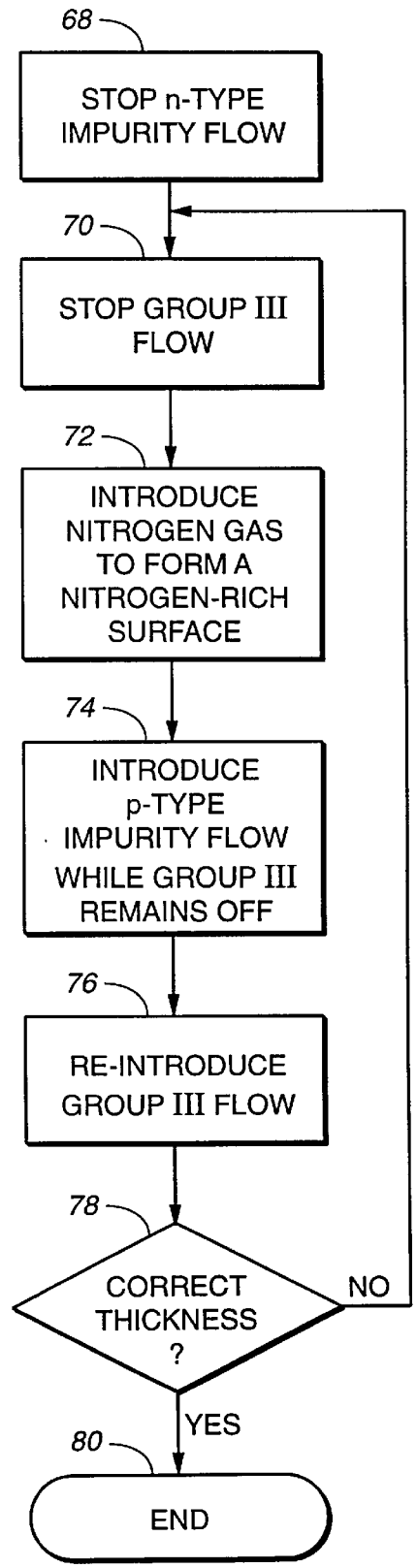
FIG._3

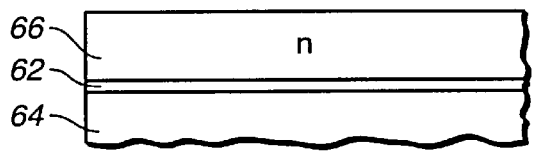
FIG._4A
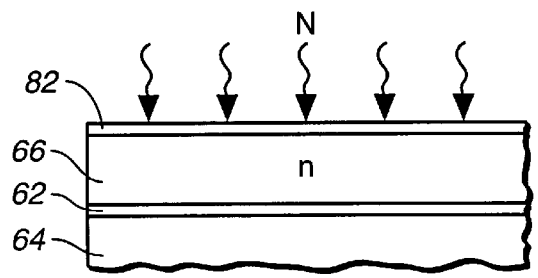
FIG._4B
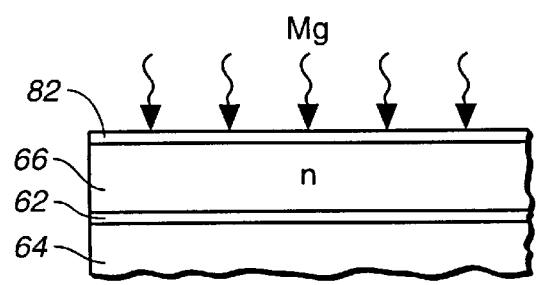
FIG._4C
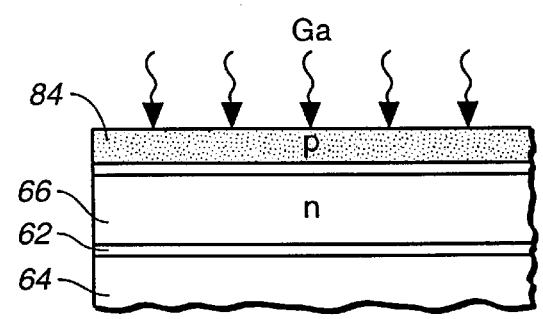
FIG._4D
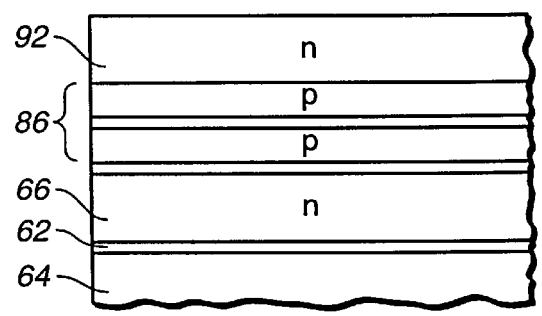
FIG._4E

METHOD OF DOPING GAN LAYERS P-TYPE FOR DEVICE FABRICATION

GOVERNMENT RIGHTS

This invention was made under government contract No. NAS5-38079 and, therefore, the U.S. government may have rights in this invention.

BACKGROUND OF THE INVENTION

1. Technical Field

This invention relates to semiconductor devices and, more particularly, to a method of doping Group III-V compound semiconductor crystal layers with p-type impurities.

2. Discussion

Group III-V, especially Group III nitride compound semiconductor materials such as gallium nitride (GaN), gallium aluminum nitride (GaAlN), indium gallium nitride (InGaN) and indium aluminum gallium nitride (InAlGaN) are promising as materials for light-emitting devices. Various techniques are known for growing Group III nitride semiconductor crystal layers such as the metalorganic chemical vapor deposition (MOCVD) method, the molecular beam epitaxy method, and the hydride vapor phase epitaxy method. The MOCVD method is also sometimes referred to as the OMVPE process (organometallic vapor-phase epitaxy). These methods are discussed in the technical literature and need not be described in detail herein. It should be noted, however, that all of these methods use separate sources for active nitrogen and for the Group III elements that react to form a Group III nitride layer on a suitable substrate.

There is great interest in GaN growth for electronic devices such as light emitting diodes and laser diodes which require pn junctions necessitating the introduction of p-type and n-type impurities into GaN layers. N-type doping of GaN has not presented much of a problem. However, difficulties have been experienced in satisfactorily doping GaN with p-type impurities. Examples of prior art techniques for doping p-type semiconductor devices of this type is disclosed, for example, in U.S. Pat. No. 5,306,662 and the following papers: Maruska et al, "Violet Luminescence of Mg-doped GaN", *Applied Physics Letters*, Vol. 22, No. 6, 15 Mar. 1973; Amano et al, "P-type Conduction in Mg-Doped GaN Treated with Low-Energy Electron Beam Irradiation (LEEBI)", *Japanese Journal of Applied Physics*, Vol. 28, No. 12, December 1988, pp. L2112–L2114 and Nakamura et al, "Thermal Annealing Effects on P-Type Mg-Doped GaN Films", *Japanese Journal of Applied Physics*, Vol. 31 (1992) pp. L139–L142.

Unfortunately, it has been extremely difficult to obtain p-type GaN layers with a high p-type free carrier (hole) concentration, e.g., exceeding $1 \times 10^{18}$ cm$^{-3}$. The achievement of high p-type doping levels is hindered generally by several factors. The first factor is high acceptor ionization energy which results in incomplete activation of acceptors at normal working temperatures. The other factor is the interaction of acceptor impurities with material defects in Group III nitrides which results in a formation of deep levels in a forbidden gap. For instance, Zn, which is widely used in other III-V materials as a p-type dopant, is known to form preferentially deep levels in GaN resulting in high-resistivity material. Even the only currently known acceptor impurity successfully used for p-type doping of GaN-magnesium (Mg), was shown to form a sufficient amount of deep levels to be measured and identified. These levels may tentatively be described as being formed by Mg atoms residing on nitrogen sites (while shallow acceptors are formed by Mg atoms in the Group III sublattice). Magnesium also has an extremely high vapor pressure at growth temperatures commonly used for GaN growth. Thus, to achieve a sufficiently high Mg concentration, extremely high flows of the Mg source should be used. Unfortunately, it has been observed that very high Mg source concentrations at the growth interface can lead to morphology deterioration of the growing GaN film.

Therefore, it would be desirable to provide a commercially practical method for solving one or more of these difficulties in obtaining a semiconductor layer, particularly of a Group III nitride compound, with a high concentration of p-type impurities.

SUMMARY OF THE INVENTION

In accordance with the teachings of the present invention, a method of doping a Group III-V, particularly a Group III nitride, compound semiconductor crystal layer is provided. In the preferred embodiment, a source of Group III elements and a separate source of nitrogen are introduced into a reactor in which a substrate is placed and the surface temperature of the substrate is held to a sufficiently high temperature to grow a first epitaxial layer of a Group III nitride compound semiconductor over the substrate, either directly on the substrate or over additional layers thereon. Thereafter, the Group III gas flow is stopped to allow the nitrogen reactive gas to form a nitrogen-rich surface on the first layer. Then, a source of p-type dopant is introduced into the reactor while the flow of the Group III element source remains off. This allows the p-type dopant impurities to bond with nitrogen atoms on the nitrogen-rich surface. Thereafter, the Group III element source is re-introduced into the reactor to resume growth of semiconductor material. Alternating flows of p-type impurity gases and the source of Group III elements can be repeated, as desired, along with selected introduction of n-type impurities, to form one or more pn junctions, as desired, with a high concentration of p-type dopant levels.

BRIEF DESCRIPTION OF THE DRAWINGS

The various advantages of the present invention will become apparent to those skilled in the art after reading the following specification and by reference to the drawings in which:

FIG. 1 is a block diagram of a reactor system used in practicing the preferred embodiment of this invention;

FIG. 2 is a generalized flow chart illustrating the basic steps of forming a semiconductor device according to the preferred embodiment;

FIG. 3 is a flow chart which details the steps employed in doping the semiconductor device with p-type impurities; and FIGS. 4A–4E comprise a sequence of cross sectional views of the semiconductor device during various processing steps.

DETAILED DESCRIPTION OF THE PREFERRED EMBODIMENT

It should be understood from the outset that while this invention will be described in connection with the best mode currently known for practicing this invention, persons of ordinary skill in the art will realize that other modifications and alternative methods can be employed to achieve the goals of this invention. Therefore, the description of the following embodiment is not intended to be construed as limiting the scope of this invention.

With this caveat in mind, FIG. 1 illustrates an MOCVD reactor system 10 for carrying out the teachings of this invention. Reactor 10 and its general operation is known in the art and is described, for example, in Dupuis et al, "Preparation and Properties of $Ga_{1-x}Al_xAs$—GaAs Heterostructure Lasers Grown by Metalorganic Chemical Vapor Deposition", *IEEE Journal of Quantum Electronics*, Vol. QE-15, No. 3, 1979, pp. 128–135., which is hereby incorporated by reference. Other types of reactors, of course, could be employed provided that they utilize separate sources of Group V elements (particularly active nitrogen) and Group III elements so that their respective flows can be independently regulated.

Briefly, reactor system 10 includes one or more sources of Group III elements such as trimethylgallium (TMGa) source 12 for forming gallium and trimethylaluminum (TMAl) source 13 for aluminum, if desired. For purposes of this invention, a Group III element source shall mean a substance capable of providing atoms of one or more of the Group III elements in the Periodic Table (B,Al, Ga, In, Tl) for purposes of epitaxially growing semiconductor crystals in a reactor. Likewise, a Group V element source shall be a substance capable of providing atoms of one or more of the Group V elements in the Periodic Table (N,P,As,Sb,Bi). A source of active nitrogen shall mean a substance capable of providing reactive nitrogen atoms at the growth surface.

This invention will be described in forming a gallium nitride semiconductor device in which, TMGa serves as the Group III element source 12 and ammonia gas ($NH_3$) serves as the source 32 of Group V elements, here active nitrogen. However, it should be understood that other combinations of Group III element sources as well as other sources of active nitrogen such as hydrazyne or plasma-activated nitrogen can be used in accordance with the teachings of this invention. In this embodiment, TMGa Group III source 12 is a liquid near room temperature with a relatively high vapor pressure. A carrier gas which can be hydrogen ($H_2$), nitrogen ($N_2$), helium (He) or argon (Ar) from source 14, is therefore supplied through valve 26 (of valve bank 16–28) to transport the vapors of Group III source 12 into the reactor 30. As will appear, reactor system 10 further includes an n-type impurity source 34 in the form of silane ($SiH_4$). Vapors of a p-type impurity source 36 provided by ($C_5H_5)_2Mg$, often referred to as $Cp_2Mg$ solid, is selectively carried by the carrier gas from 14 through valve 24 into the reactor 30 for p-type doping, as will be explained in more detail below. The reactor system 10 also includes a quartz vessel 38 which houses a susceptor 40. Radio frequency (RF) power is provided by coils 42 to heat a substrate 64 placed on susceptor 40.

The method of this invention will be described in connection with making a GaN semiconductor device having at least one pn junction and, in particular, a laser diode. However, the broader aspects of this invention are not limited to this specific type of device, as will become apparent.

FIG. 2 illustrates the general steps 50–60 involved in making the semiconductor device. With additional reference to FIG. 4A, a buffer layer 62 is formed on a substrate 64. The purpose of buffer layer 62 is to provide sufficient amount of nucleation sites for further growth and to partially relieve an interfacial strain when growing on such foreign substrates as sapphire, silicon carbide or silicon. However, buffer layer 62 may not be required if layers are grown on a GaN substrate or other substrates which are close in their properties to GaN. Buffer layer 62 is formed by $Ga_xAl_{1-x}N$ (0<x<1) grown the temperatures where at uniform deposition of the layer on the substrate can be achieved. These temperature are usually in the range of 480°–580° C. Then the temperature is raised to the growth temperature of the layers of the active device structure which will now be described.

An n-type gallium nitride layer 66 is formed on buffer layer 62. This is accomplished by opening valve 18 to allow the n-type impurity source 34 to flow into reactor 30 along with the gallium from Group III source 12. Nitrogen source 32 is also introduced into the reactor 30 via valve 16.

In accordance with one aspect of this invention, extremely smooth epitaxial films can be grown at relatively low temperatures. The growth of smooth or planar layers is one of the critical conditions for the fabrication of low-loss uniform gain semiconductor lasers. In the past, it was necessary to use a rather high and narrow temperature interval of 1020°–1080° C. in order to form a smooth epitaxial film of gallium nitride. The growth rate was about 2–3 micrometers/hour and the nitrogen source ($NH_3$) flowed at about 3–10 slm (standard liters per minute). It has been reported that hexagonal growth pyramids develop on the growth surface of GaN at higher temperatures. At lower temperatures, a characteristic "sponge-like" morphology of the gallium nitride surface is often observed. This latter process is sometime explained by so-called "statistical roughening"—when atoms delivered to the growth surface are incorporated into the solid without sufficient diffusion along the surface.

The relatively high temperature required for smooth epitaxial surfaces unfortunately also leads to another difficulty in obtaining a high p-type concentration in gallium nitride devices. As was mentioned above, magnesium (Mg), the most widely used p-type dopant, has a very high evaporation rate from the growth surface at high temperatures.

In accordance with this aspect of the invention, the power to the RF coils 42 is suitably adjusted to reduce the temperature within the reactor 30 to between about 850° and 1075° C. In addition, the flow from the nitrogen source 32 is reduced to below about 300 sccm (standard cubic centimeters per minute) and, preferably, between about 300 and 100 sccm. At this flow rate, extremely smooth films can be successfully grown while at the same time allowing for a high concentration of p-type impurities, here, magnesium to be introduced into the structure. In this embodiment, the n-type layer 66 is approximately 3 µm thick and has an n-type impurity concentration of about $2 \times 10^8$ $cm^{-3}$.

As can be seen in FIG. 2, the next step 56 is to grow a p-type layer onto the n-type layer 66 to form a pn junction. Step 56 is shown in more detail in FIG. 3.

The temperatures and flows into the reactor 30 remain the same during step 56 as for step 54 except that valve 18 is closed to stop the n-type impurity flow (step 68). In addition, valve 24 is also closed so that the vapors of the Group III source 12 are no longer introduced into the reactor 30 (step 70). The nitrogen source 32, however, remains open so that nitrogen source gas forms a nitrogen-rich surface 82 on n-type layer 66 as shown in FIG. 4B. The nitrogen source 32 should provide essentially the only reactant to reactor 30 for a period of time of between about 1–60 seconds to saturate the growth surface with active nitrogen. It is believed that monolayer of nitrogen is sufficient to provide enough uncoupled nitrogen bonds to which the p-type impurities (Mg) can bond to achieve satisfactory results. In this regard, it should be noted that the relative thicknesses shown in the drawings are for illustrative purposes only and have been exaggerated for ease in understanding the invention.

While the Group III element source 12 remains shut off, valve 24 is opened to now carry the vapors of p-type impurity source 36 into the reactor 30 where it reacts to provide magnesium (Mg) atoms as illustrated in FIG. 4C. An advantage of the method is at least three-fold. First, the growth surface is highly saturated with nitrogen and the probability of Mg atoms being attached on nitrogen sites resulting in formation of deep levels is very low. Second, since there are no Ga atoms at the growth surface, the Mg species have a better chance to be absorbed at the steps on the growth surface where the absorption energy is higher and re-evaporation rate is lower. Therefore, a lower partial pressure of the Mg source is required to achieve the same Mg incorporation rate. If Ga species were present they could saturate the steps thereby preventing the attachment of Mg atoms. Preferably, step 74 is accomplished at a flow rate from source 36 of about between 0.05 and 0.5 $\mu$mole/min. for a period of about between 3 seconds and 30 seconds.

Then, as illustrated in step 76, the Group III source is reintroduced by opening valve 26 to carry the vapors into reactor 30 where they react to generate gallium atoms. Nitrogen source 32 remains open to provide a source of nitrogen atoms which, together with the gallium atoms, form gallium nitride layer 84. The p-type dopant source 36 may optionally also remain open during this step depending on the background electron concentration in GaN and thickness of GaN layer in order to prevent formation of potential barriers in GaN layers.

In this non-limiting example, the p-type source 36 is set at a flow of about between 0 and 0.5 $\mu$mole/min., preferably 0.2 $\mu$mole/min., while the Group III element flow is about between 10 and 60 $\mu$mole/min., preferably 30 $\mu$mole/min. The nitrogen flow from source 32 remains as previously described. The time period for step 76 is between about 5–60 seconds, preferably 10 seconds. Normally, this will result in a growth of GaN layer 84 of about between 2 and 30 nm in thickness.

The aforementioned cycle typically needs to be repeated in order to achieve the ultimate thickness of the p-type region 86. In other words, each cycle or loop represented by step 70–76 in FIG. 3 should be repeated to gradually build up the final desired thickness of the p-type region 86. FIG. 4E represents this repeated cycle to achieve the desired ultimate thickness for p-type region 86. For example, steps 70 and 72 are repeated to result in an additional nitrogen-rich surface 88, followed by the introduction of p-type impurity flow (step 74) and then the reintroduction of the Group III element flow (step 76) resulting in another p-type layer 90. Typically, this cycle is repeated as necessary to achieve an ultimate p-type region 86 of approximately 20 nm to 2000 nm in thickness.

Once the desired thickness of p-type region 86 is achieved, the process returns to the formation of another n-type layer 92, if desired, as illustrated in step 54. The process continues as necessary in order to form the desired number of pn junctions for the ultimate device.

While the exact physical phenomena of the present invention is not completely understood, it is believed that higher p-type dopant concentration levels can be achieved by this invention because in steps 72 and 74 the magnesium atoms have a better opportunity to attach to nitrogen sites than if the magnesium atoms were competing with the gallium atoms since gallium species are present at much higher concentrations at the growth surface and gallium has much lower vapor pressure at the typical GaN growth temperatures. The cessation of the Group III flow in step 74 allows the magnesium atoms to attach to a site that may otherwise be taken by a Ga atom or blocked by Ga species. Magnesium is a shallow acceptor when it is located on gallium sites and forms a deep level if on nitrogen site. An introduction of the "nitrogen saturation" step appears to result in occupation of nitrogen sites at the growth surface making attachment of dopant atoms into the nitrogen sublattice difficult. Accordingly, this invention provides the capability for providing higher concentration of p-type dopants in Group III nitride compounds. Concentration levels exceeding $10^{18}$ cm$^{-3}$ can be achieved in comparison with other techniques wherein concentrations of only about 3 to $5\times10^{17}$ cm$^{-3}$ are typically obtained.

Therefore, while this invention has been described in connection with a particular example thereof, no limitation is intended thereby except as defined in the following claims.

What is claimed is:

1. In a method of making a semiconductor device in which reactants from a Group V element source, a Group III element source, and a p-type impurity source are selectively introduced into a reactor, said method comprising:

a.) introducing a flow of reactant from the Group V element source while impeding the flow of reactant from the Group III element source;

b.) introducing reactant from the p-type impurity source into the reactor while continuing to impede the flow of reactant from the Group III element source; and c.) introducing reactant from the Group III element source to grow a p-type Group III-V based compound semiconductor layer.

2. The method of claim 1 wherein the layer has a p-type impurity concentration exceeding $1\times10^{18}$ cm$^{-3}$.

3. The method of claim 1 which further comprises:

repeating steps a.)–c.) to achieve a p-type region of desired thickness.

4. The method of claim 1 wherein the flow of reactant from the Group V element source is below about 300 sccm and the temperature in the reactor is between about 850° and 1075° C.

5. The method of claim 1 wherein the Group V element is nitrogen (N), the Group III element is gallium (Ga), and the p-type impurity is magnesium (Mg).

6. The method of claim 5 wherein the Group V element source is selected from the group of ammonia, hydrazyne and plasma-activated nitrogen.

7. The method of claim 6 wherein the Group III element source is trimethylgallium.

8. The method of claim 1 wherein step a.) is carried out for about 1–60 seconds.

9. The method of claim 8 wherein step b.) is carried out for about 3–30 seconds.

10. The method of claim 3 wherein step c.) is carried out for about 5–60 seconds to grow said layer to a thicknesses of about 2–30 nm.

11. The method of claim 10 wherein steps a.)–c.) are repeated a sufficient number of time to grow a p-type region of 20–2000 nm in thickness.

12. A method of making a GaN-based compound semiconductor device having at least one p-n junction in a system for epitaxially growing semiconductor layers, said system having a reactor, an active nitrogen source, a gallium Group III element source, a magnesium p-type impurity source, and an n-type impurity source, said method comprising:

a.) growing an n-type semiconductor layer on a first surface by introducing the flow of reactants from the active nitrogen source, the Group III element source and the n-type impurity source into the reactor;

b.) depositing a nitrogen-rich surface onto the n-type layer by continuing the flow of reactant from the active nitrogen source while impeding the flow of reactants from the Group III element source and the n-type impurity source;

c.) introducing reactant from the p-type impurity source into the reactor while continuing to impede flow of reactants from the Group III element source and the n-type impurity source;

d.) thereafter, reintroducing reactant from the Group III element source to form a p-type Group III-nitride compound semiconductor crystal layer; and e.) repeating steps b.)–d.) to achieve a p-type region of desired thickness.

13. The method of claim 12 wherein steps a.)–e.) are repeated to form additional p-n junctions.

14. The method of claim 12 wherein the p-type impurity concentration in the p-type region exceeds $1\times10^{18}$ cm$^{-3}$.

15. The method of claim 12 wherein the flow of reactant from the active nitrogen source is below about 300 sccm and the temperature within the reactor is between 850° and 1075° C.

16. The method of claim 12 wherein steps b.)–e.) are repeated to grow a p-type region of between approximately 20 nm and 2,000 nm in thickness.

17. A method of making a semiconductor device in which an active nitrogen source, a Group III element source, and an impurity source are selectively introduced into a reactor to epitaxially grow a semiconductor layer, said method comprising:

introducing reactants from the active nitrogen source, Group III element source and the impurity source into the reactor to epitaxially grow a semiconductor layer while heating the reactor to no more than about 1075° C and maintaining the flow of reactant from the nitrogen source to below about 300 ccm.

18. The method of claim 17 wherein the impurity source provides a source of magnesium atoms as p-type impurities to generate a p-type semiconductor region having an impurity concentration exceeding $1\times10^{18}$ cm$^{-3}$.

19. The method of claim 18 wherein the Group III element source provides a source of gallium atoms.

20. The method of claim 19 which further comprises forming at least one p-n junction.

21. The method of claim 1 wherein the flow of reactant from the Group V element source continues throughout steps a.)–c.).

22. The method of claim 12 wherein the active nitrogen source remains flowing through steps a.)–e.).

23. A method of making a semiconductor device layer on a growth surface, said method comprising:

providing an active nitrogen source;

providing a source of Group III elements;

providing an impurity source;

introducing reactants from the active nitrogen source, the Group III element source and the impurity source into a reactor;

heating the reactor to a temperature of about 850° C. to 1075° C. to reduce evaporation of the impurity from the growth surface; and reducing the flow of reactant from the nitrogen source so as to epitaxially grow a Group Ill-V semiconductor layer having an impurity concentration exceeding 1×18 cm$^{-3}$.

24. The method of claim 23 wherein the impurity source is a p-type impurity.

25. The method of claim 24 wherein the p-type impurity is magnesium and the reactor is heated to no more than about 1075° C. and wherein the flow of reactant from nitrogen source is below about 300 ccm.

* * * * *

UNITED STATES PATENT AND TRADEMARK OFFICE
CERTIFICATE OF CORRECTION

PATENT NO. : 5,888,886
DATED : March 30, 1999
INVENTOR(S) : Boris N. Sverdlov, et al.

It is certified that error appears in the above-identified patent and that said Letters Patent is hereby corrected as shown below:

On the title page, Item [56], add the following references:

FOREIGN PATENT OR PUBLISHED FOREIGN PATENT APPLICATION

| | | DOCUMENT NUMBER | | | | PUBLICATION DATE | COUNTRY OR PATENT OFFICE | CLASS | SUBCLASS | TRANSLATION YES | NO |
|---|---|---|---|---|---|---|---|---|---|---|---|
| | | EP | 0 | 1 9 6 | 245 A | 10/1986 | Europe | | | | |

OTHER DOCUMENTS(including Author, Title, Date, Pertinent Pages, etc.

| EXAMINER INITIAL | |
|---|---|
| | Salvador, A. et al, "Near ultraviolet luminescence of Be doped GaN grown by reactive molecular beam epitaxy using ammonia", APPLIED PHYSICS LETTERS, vol. 69, no. 18, 28 October 1996, pages 2692-2694 |
| | Ohtsuka, N. et al, "Extremely high Be doping of InGaAs by low-temperature atomic layer epitaxy", JOURNAL OF CRYSTAL GROWTH, vol. 115, no. 1/04, 2 December 1991 pages 460-463 |

Signed and Sealed this

Fourteenth Day of September, 1999

Attest:

Q. TODD DICKINSON

*Attesting Officer*  *Acting Commissioner of Patents and Trademarks*